US009105783B2

(12) United States Patent
Okorogu et al.

(10) Patent No.: US 9,105,783 B2
(45) Date of Patent: Aug. 11, 2015

(54) HOLOGRAPHIC SOLAR CONCENTRATOR

(75) Inventors: Albert O. Okorogu, Canyon Country, CA (US); Dean C. Marvin, Torrance, CA (US); Simon H. Liu, Redondo Beach, CA (US); Alonzo Prater, Gardena, CA (US)

(73) Assignee: The Aerospace Corporation, El Segundo, CA (US)

( * ) Notice: Subject to any disclaimer, the term of this patent is extended or adjusted under 35 U.S.C. 154(b) by 1246 days.

(21) Appl. No.: 12/321,777

(22) Filed: Jan. 26, 2009

(65) Prior Publication Data

US 2010/0186818 A1   Jul. 29, 2010

(51) Int. Cl.
*H01L 31/00* (2006.01)
*H01L 31/0232* (2014.01)
*H01L 31/052* (2014.01)

(52) U.S. Cl.
CPC ............. *H01L 31/0522* (2013.01); *Y02E 10/52* (2013.01)

(58) Field of Classification Search
USPC .................. 136/255, 259, 257, 243, 246, 292
IPC ........................... H01L 31/042,31/0232, 31/101
See application file for complete search history.

(56) References Cited

U.S. PATENT DOCUMENTS

| | | | |
|---|---|---|---|
| 4,204,881 A * | 5/1980 | McGrew | 136/246 |
| 4,367,366 A * | 1/1983 | Bloss et al. | 136/246 |
| 5,089,055 A * | 2/1992 | Nakamura | 136/248 |
| 5,594,560 A * | 1/1997 | Jelley et al. | 359/15 |
| 6,274,860 B1 * | 8/2001 | Rosenberg | 250/203.4 |
| 6,368,892 B1 * | 4/2002 | Arya | 438/96 |
| 6,504,976 B1 * | 1/2003 | Polynkin et al. | 385/37 |
| 7,469,082 B1 * | 12/2008 | Okorogu | 385/37 |
| 7,873,257 B2 * | 1/2011 | Morgan | 385/146 |
| 2001/0027805 A1 * | 10/2001 | Ho et al. | 136/256 |
| 2006/0130899 A1 * | 6/2006 | Koester | 137/269 |
| 2007/0107770 A1 * | 5/2007 | Rust | 136/246 |
| 2007/0277869 A1 * | 12/2007 | Shan et al. | 136/246 |
| 2008/0314436 A1 * | 12/2008 | O'Connell et al. | 136/246 |
| 2009/0065044 A1 * | 3/2009 | Kim | 136/246 |
| 2009/0114266 A1 * | 5/2009 | Biles et al. | 136/246 |

(Continued)

OTHER PUBLICATIONS

Ludman, J. E.; Riccobono, J. R.; Caulfield, H. J.; Upton, T. D. "Solar holography." Holography: A Tribute to Yuri Denisyuk and Emmett Leith, H. John Caulfield, Editor, Proceedings of SPIE vol. 4737, 2002, p. 35-43.*

(Continued)

*Primary Examiner* — Jeffrey T Barton
*Assistant Examiner* — Meisha Binkley
(74) *Attorney, Agent, or Firm* — Jones Day

(57) ABSTRACT

A solar concentrator receives sunlight for generating solar power with the concentrator including holographic optical element (HOE) separators for separating sunlight into separated bands, including HOE concentrators for concentrating the separated bands into concentrated bands, including HOE reflectors for reflecting the concentrated bands as reflected bands onto a multiple junction photovoltaic solar cell for generating the solar power with reduced aberrations of the bands for improved conversion of the solar light into the generator solar power, all of which can be constructed in an integrated structure using spacers, waveguides, and a substrate, where the HOEs use chirp Bragg gratings for reducing optical aberrations of the separated, concentrated, and reflected optical bands, with the option of multiple HOE separators for receiving sunlight from various angles of incidence.

15 Claims, 3 Drawing Sheets

MULTIDIRECTIONAL MULTIPLE HOE SOLAR CONCENTRATOR

(56) References Cited

U.S. PATENT DOCUMENTS

| | | | |
|---|---|---|---|
| 2009/0199893 A1* | 8/2009 | Bita et al. | 136/248 |
| 2010/0051087 A1* | 3/2010 | Keshner et al. | 136/246 |
| 2010/0095999 A1* | 4/2010 | Menon | 136/246 |
| 2010/0108124 A1* | 5/2010 | Knox et al. | 136/246 |

OTHER PUBLICATIONS

Anders, G.; Corlatan, D.; Schmid, H. D. "Holographic Soft Concentrators for PV Applications." 10th European Photovoltaic Solar Energy Conference, Apr. 8-12, 1991 Lisbon, Portugal, p. 1229-1232.*

Ouellette, F. "Dispersion cancellation using linearly chirped Bragg grating filters in optical waveguide." Optics Letters vol. 12 No. 10, Oct. 1987, p. 847-849.* http://web.archive.org/web/20070107080345/http://www.prismsolar.com/homepage.html.*

Energy Basics: Photovoltaic Cell Structures, Energy Efficiency & Renewable Energy, http://www.eere.energy.gov/basics/renewable_energy/pv_cell_structures.html accessed Sep. 28, 2012.*

The Physics Classroom, Light Waves and Color Lesson 2: Color and Vision, Light Absorption, Reflection, and Transmission, http://www.physicsclassroom.com/class/light/u1212c.cfm accessed 910/2/2012.*

Amitai et al., "Design of holographic optical elements by using recursive techniques," J. Opt. Soc. Am., 5(5): 702-712 (1988).

Benson, Scott W., "Solar Power for Outer Planets Study," National Aeronautics and Space Administration, Presentation to Outer Planets Assessment Group (2007).

Champagne, Edwin B., "Nonparaxial Imaging, Magnification, and Aberration Properties in Holography," Journal of the Optical Society of America, 57(1): 51-55 (1967).

Chen et al., "Design of a holographic lens for the infrared," Applied Optics, 26(10): 1983-1988 (1987).

Latta, J.N., "Computer-Based Analysis of Hologram Imagery and Aberrations. I. Hologram Types and Their Nonchromatic Aberrations," Applied Optics, 10(3): 599-608, (1971).

Moharam et al., "Rigorous coupled-wave analysis of planar-grating diffraction," J. Opt. Soc. Am., 71(7): 811-818 (1981).

O'Neill et al., "Stretched Lens Array SquareRigger (SLASR): A New Space Array for High-Power Missions," 4$^{th}$ World Conference on Photovoltaic Energy Conversion, Waikoloa, Hawaii, May 7-12, 2006.

Spence et al., "Next Generation UltraFlex Solar Array for NASA's New Millennium Program Space Technology 8," IEEEAC paper #1539, 1:1-13 (2004).

* cited by examiner

MULTIDIRECTIONAL MULTIPLE HOE SOLAR CONCENTRATOR

MULTIPLE HOE WAVEGUIDE STACKED SOLAR CONCENTRATOR

MULTIPLE HOE WAVEGUIDE SERIAL SOLAR CONCENTRATOR

HOLOGRAPHIC SOLAR CONCENTRATOR

FIELD OF THE INVENTION

The invention relates to the field of solar concentrators. More particularly the present invention relates to a solar concentrator using holographic optical processes.

BACKGROUND OF THE INVENTION

Future high-power space missions will demand more solar array power with longer lifetimes. One method of increasing solar array power is the use of concentrating systems that increase the amount of incident sunlight for each solar cell. In the last three decades, several solar concentrator designs based on reflective, refractive, fiber-optic, and holographic systems have been developed. While some of these technologies have been developed mostly for terrestrial applications, with a promise of low-cost, high-levels of performance, and simplified manufacturing, few have been developed for space and on the move communication applications. Even for these systems, the solar conversion efficiency is low. In addition, for some solar power systems, the designs require solar tracking, specified power, lightweight packaging, and stiffness, all of which pose difficult engineering and design challenges.

Holographic optical elements or holographic gratings are holographically recorded holographic optical elements (HOE), by a wavefront reconstruction technique originally invented by Denis Gabor in 1948. The HOE functions as a lens and a mirror. Imaging properties have extensively been studied over the many years. The HOE manufacturing technique involves dividing coherent light from a laser into two equally polarized monochromatic waves of equal intensity where standing waves are created in the region where two waves overlap. A photosensitive plate in the overlap region records the intesity of the interference pattern for generating a holographic grating. The HOES can be volume or surface relief gratings. The volumetric HOE is where modulated light intensity creates a modulation of the index of refraction within the HOE volume. The surface HOE is where the interference pattern is projected on the surface. HOES can be transmissive or reflective types depending on how the interference patterns are recorded.

According to the Kogelnik theorem, transmission holographic diffraction efficiency is sine $\eta=\sin^2 [v^2+\xi^2]^{1/2}/[1+\xi^2/v^2]$ where $\xi$ is a detuning parameter from the Bragg condition and v is a phase factor. For reflection holograms, the diffraction efficiency for polarization is given by $\eta=[1+[1+\xi^2/v^2]/\sin h2(v^2-\xi^2)]^{-1}$, where $\eta$ is the efficiency. Current HOE materials are limited in wavelength sensitivity, thereby limiting applicable wavelengths and bandwidths. For most applications, $\lambda_c$ and $\lambda_r$ are different. This introduces aberrations where $\lambda_c-\lambda_r\neq 0$, and where $\lambda_c$ is the HOE fabrication wavelength and $\lambda_r$ is the application or playback wavelength. Inadequacies of current HOE systems limit their applications. The limitations include limited bandwidth, inoperability for 400>$\lambda$>700 nm, manufacturing problems, incident angular selectivity, and radiation safety. The operation and applicability of the solar HOE lies in extending the limited bandwidth of HOEs in comparison to the baseline solar spectrum and quantum efficiency of solar cells. In addition, a cost-effective technique is needed to extend the applicable $\lambda$ to longer wavelengths.

In a paper by J. E. Ludman, J. R. Riccobono, H. J. Caulfield, T. D. Upton, "Solar Holography", Holography: A tribute to Yuri Denisyuk and Emmett Leith, John Caulfield, Ed., Proc. SPIE, vol. 4737, p. 35, 2002, a solar holographic lens concentration and solar collector is taught having a single concentrator with a low bandwidth. The single separator and concentrator focus bands into serial photovoltaic (PV) cells. The concentrator does not separate the bands and then concentrates the band onto a single photovoltaic cell stack thereby having low conversion efficiency. The concentrator provides limited bandwidth and low power conversion efficiency. There are no means provided for constructing a complete commercial integrated device. The construction is not amenable to packaging a commercial device. The design is an inflexible HOE solar concentrator design. The device does not protect PV solar cells from harmful radiation including infrared, ultraviolet, gamma, and x-ray cosmic radiation, and does not enable solar radiation tracking from a wide range of incidence angles.

The HOE is inherently limited in its applicability. One problem is the aberration produced, because of wavelength shifts and dispersion. Another problem is low optical diffraction efficiency, and hence, low signal-noise-ratio, because of the inability to completely fulfill the Bragg condition. The shift in wavelength causes both longitudinal chromatic dispersion and geometrical aberrations. Therefore, when a HOE is used as a collector of an incident collimated multispectral or white light, the HOE disperses the beam in accordance to the Bragg condition, with limited bandwidths of the dispersed bands with undesirable optical aberrations.

Prism Solar Technologies produces a solar cell concentrator having a bandwidth for an unshielded PV cell and an HOE reflector displaced in a waveguide, so that sunlight is reflected and concentrated from the reflector to the PV cell with all components supported by a substrate. The waveguide is for receiving sunlight and routing the sunlight without band separation to the reflector with exiting light as transmitted light. The concentrator provides undesirable uncompensated aberrations such as dispersion and wavelength shifts produced by the reflector, so that the bandwidth of the reflected bands are not precisely matched to the band gaps of the PV solar cells, and therefore, the concentrator has limited bandwidths and low conversion efficiency.

U.S. Pat. No. 7,469,082, issued Dec. 23, 2008, entitled High Power Optical Fiber Laser Array Holographic Couplers, teaches a transmissive holographic optical element. The optical element includes a chirped grating that is used to inject light as side firing laser light from an array of laser diodes into an optical fiber with a reflective holographic optical element reflecting the injected laser light through and along the optical fiber with the transmissive holographic optical element HOE and reflective HOE sandwiching a portion of an optical fiber for increased laser side firing pumping efficiency in optical fibers.

Prior art solar holographic concentrators did not provide integral construction means for separation and concentration of optical light bands resulting in uncorrected and uncompensated optical aberrations producing low power conversion efficiencies. These and other disadvantages are solved or reduced by using the invention.

SUMMARY OF THE INVENTION

An object of the invention is to provide a holographic concentrator of light from a light source.

Another object of the invention is to provide a holographic solar concentrator.

Yet another object of the invention is to provide a holographic solar concentrator where incident radiation from the sun is spectrally and spatially separated into component wavelength bands that are redirected away from the incidence direction through a waveguide and subsequently onto solar cells having respective band gap energies.

Still another object of the invention is to provide a holographic solar concentrator that is thin and lightweight in a variety of desired shapes and sizes, which can easily be integrated with existing multijunction or thin film solar array systems.

A further object of the invention is to provide a holographic solar concentrator having a wide field of view suitable for stationary non-mechanical tracking of the sun using flat optics for the collection of sunlight for improved power conversion efficiencies.

Still a further object of the invention is to provide a holographic solar concentrator that reduces solar cell exposure to harmful radiation.

Yet a further object of the invention is to provide a holographic solar concentrator that is cost effective, lightweight, and stationary using photovoltaic solar cells, while tracking the sun for improved power conversion efficiency.

The present invention is directed to a holographic solar concentrator. The concentrator can be made compact with the use of band selection lightweight holographic optics. The sun can be tracked through a large field of view using a multidirectional holographic optical element (HOE) separator. The concentrator preferably uses Bragg chirp gratings, having high diffraction efficiency leading to high conversion efficiency of light power. The concentrator is preferably a thin film split-spectrum HOE solar concentrator having that flexibility of integration into existing multiple junction solar cells over various sizes and shapes without loss in power conversion efficiency. The concentrator can reduce the effects of harmful spectra components of the solar radiation and provide greater power at reduced weight and stowed volume, with high solar power conversion efficiency and overall energy concentration greater than two times by spectrum splitting and concentration.

The concentrator includes lightweight, flexible, and broadband hybrid transmission and reflection holographic optical elements that spectrally and spatially separate the incident solar spectrum into component wavelength bands and redirect the bands of the separated radiation through a thin waveguide and spacers to photovoltaic cells with appropriately selected band gap energies. The concentrator is based on the application of lightweight and thin volume holographic Bragg grating technology, which does not require any polishing or bulk mechanical etched structures for splitting of the incident solar radiation. The concentrator passes undesirable components of the solar radiation as transmitted light to reduce the solar cell operating temperature.

The holographic optics can be robust and can be designed for any wavelength preferably in the range of 300 nm to 2.0 μm, depending on the limitation of the holographic material used. The band selection holographic optics system preferably consists of a thin waveguide sandwiched between large bandwidth transmitting and reflecting holographic optical elements (HOEs) or band selective HOEs. Using internal reflection, the selected solar radiation from the transmitting and concentrating HOE is propagated through the waveguide to the band selection reflecting HOEs, which directly inject the corresponding solar radiation into photovoltaic cells of appropriate band gap energies.

The concentrator includes an HOE separator, an HOE concentrator, and an HOE reflector that can be fabricated in any of the commercially available high efficiency photosensitive holographic recording materials. The HOEs, because of their properties, can be exploited to separate the solar spectra, from a wide range of incidence angles, into component spectra, which are brought to a common focus, away from the direction of solar incidence. This unique advantage of collecting solar radiation from a wide range of incidence angles provides for passive sun tracking. The concentrator is suitable for use with a variety of solar array shapes, sizes, and designs, including the current multiple-junction and thin film solar cells. The concentrator focuses reflected bands upon photovoltaic cells with large bandwidths resulting in high conversion efficiency. These and other advantages will become more apparent from the following detailed description of the preferred embodiment.

DETAILED DESCRIPTION OF THE PREFERRED EMBODIMENT

Figure 1:
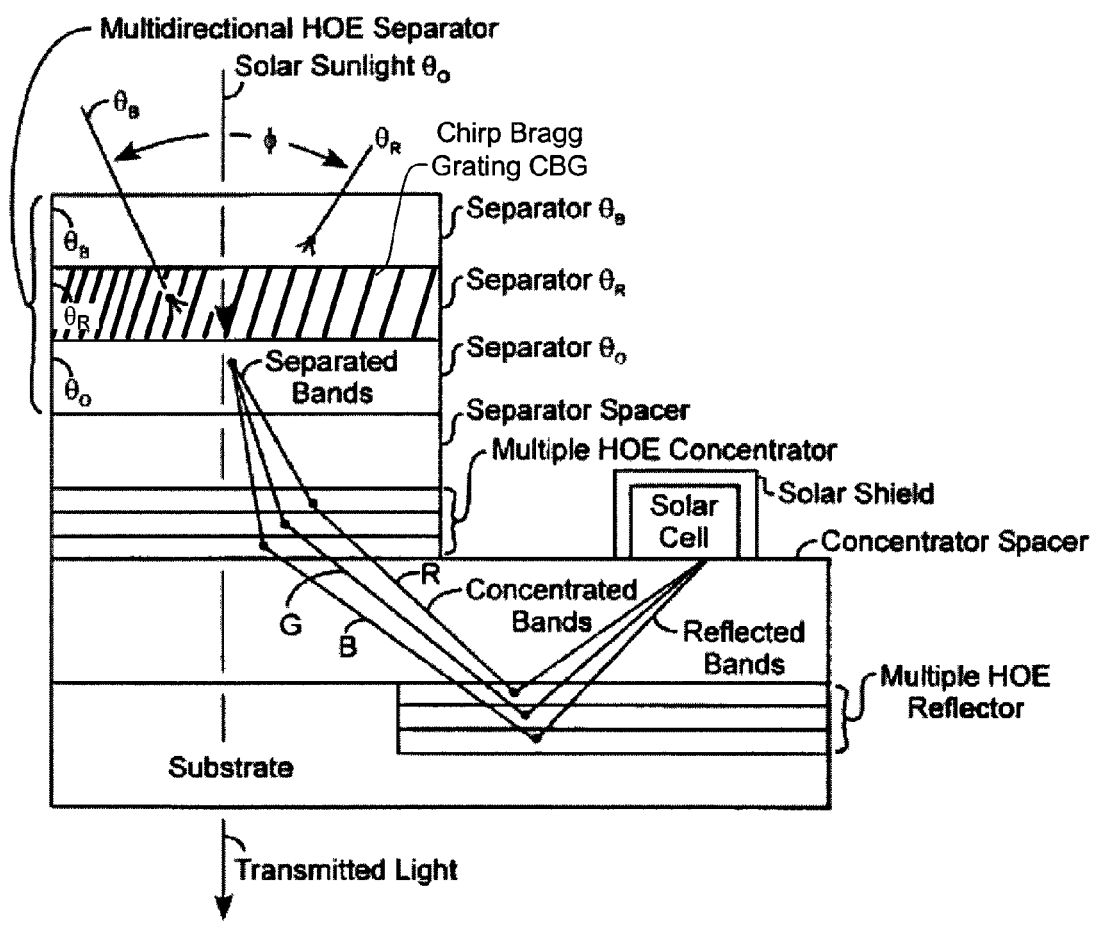
FIG. 1 is a diagram of a multidirectional multiple HOE solar concentrator.

An embodiment of the invention is described with reference to the figures using reference designations as shown in the figures. Referring to FIG. 1, a multidirectional multiple holographic element (HOE) solar concentrator received solar sunlight by one or more HOE separators, such as HOE separators $\theta_B$, $\theta_O$, and $\theta_R$ for defining a field of view $\phi$. The HOE separators $\theta_B$, $\theta_O$, and $\theta_R$ are collectively referred to as a multidirectional HOE separator, or simply the HOE separator. The HOE separator allows for the separation of the incident solar sunlight into separated optical bands. The separated bands are directed through a separator spacer to a multiple HOE concentrator having a plurality of individual respective HOE concentrators, each of which are for concentrating the separated bands into respective concentrated bands that may be for example blue, red, and green colored optical wavelength bands. Each of the HOE separators $\theta_B$, $\theta_O$, and $\theta_R$ can be multiplexed in the same hologram volume or can be laminated together with each HOE separator separating incidence light at a specific angular incidence. The multiple HOE concentrators may be simply referred to as the HOE concentrator. The HOE concentrator directs the concentrated bands through a concentrator spacer to a multiple HOE reflector likewise having a respective number of HOE reflectors for each of the concentrated bands. The multiple HOE reflectors may be simply referred to as the HOE reflector. The HOE reflector reflects the concentrated bands as reflected bands back through the concentrator spacer and onto a solar cell having a protective solar shield. The solar cell has multiple band gaps for converting the reflected bands into generated solar power. The solar cell may be a stacked solar cell or a series of solar cells. The HOE separator, separator spacer, HOE concentrator, concentrator spacer, HOE reflector, and solar cell are integrated together onto a substrate for constructing an integrated commercial device. A portion of the incident solar sunlight passes through the separator and through the substrate for exiting out of the solar concentrator as transmitted light that is not useful for power generation, and hence, does not illuminate the solar cell. The transmitted light can be infrared, ultraviolet, gamma, and x-ray radiation that could otherwise damage the solar cell. The solar cell can be a photovoltaic (PV) multiple junction solar cell, which may be a thin film solar cell.

Figure 2A:
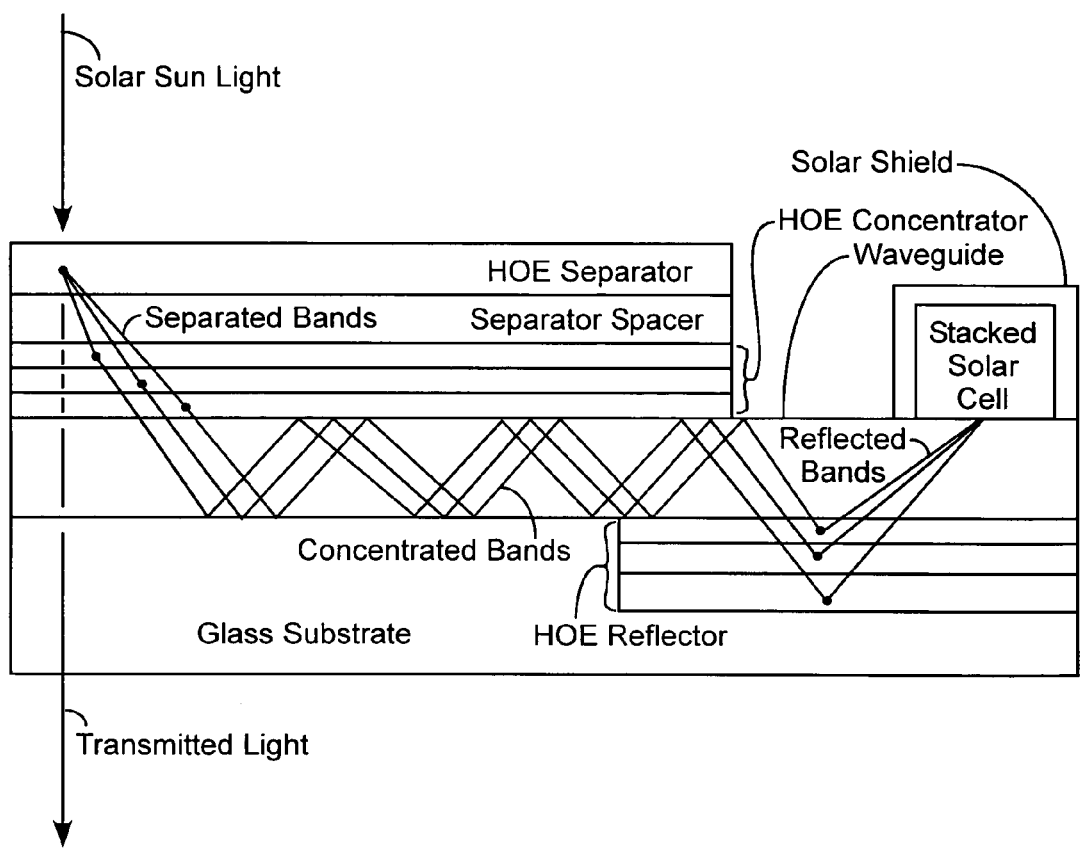
FIG. 2A is a diagram of a multiple HOE stacked solar concentrator.

Referring to FIG. 2A, a multiple HOE waveguide stacked solar concentrator includes the HOE separator for separating incident solar sunlight into separated bands that are directed through the separator spacer and to the HOE concentrator that then provides concentrated bands that are propagated along a waveguide to the HOE reflector. The solar cell is a stacked solar cell with a solar shield. The reflected bands are focused to a common point on the stacked solar cell for generating solar power. The substrate may be a glass substrate for communicating the transmitted light and for supporting the HOE separator, the separator spacer, the HOE concentrator, the waveguide, the HOE reflector, and the stacked solar cell.

Figure 2B:
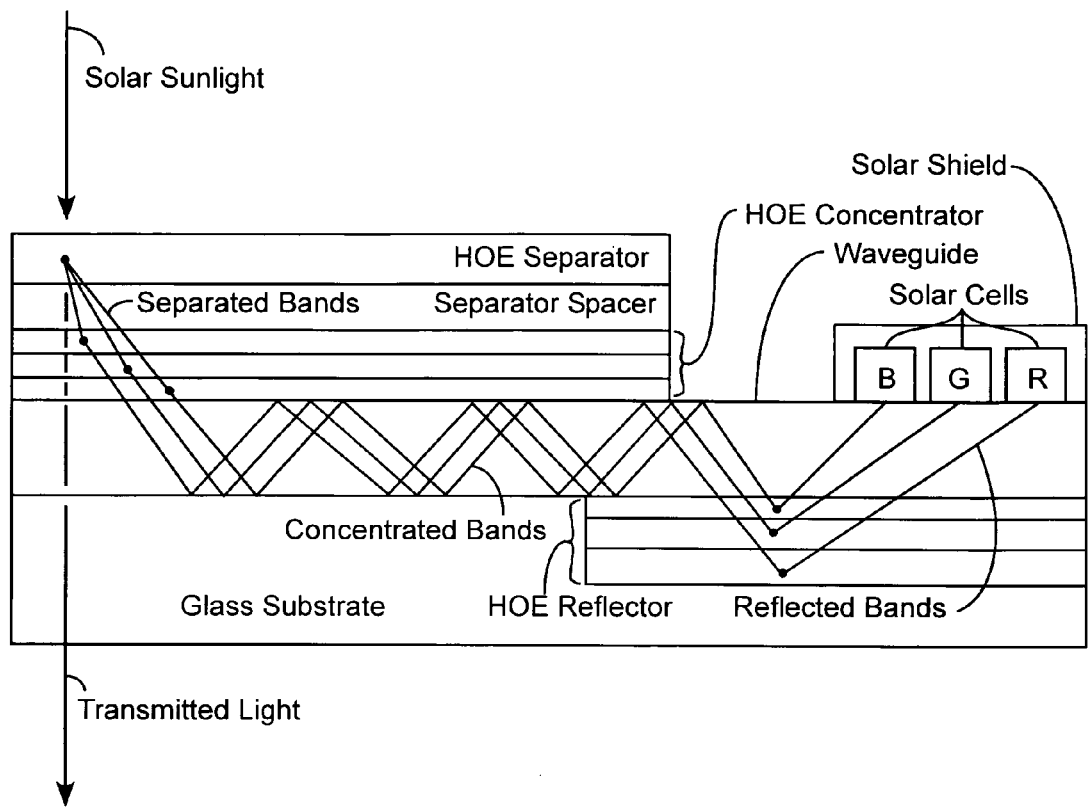
FIG. 2B is a diagram of a multiple HOE waveguide solar concentrator.

Referring to FIG. 2B, a multiple HOE waveguide serial solar concentrator receives incident solar sunlight in the HOE separator generating the separated bands that are directed through the separator spacer to the HOE concentrator. The HOE concentrator generates the concentrated bands that are directed into a waveguide at an appropriate angle for propagation of the concentrated bands towards and to the HOE reflector for generating the reflected bands. The respected bands are respectively focused upon a series of solar cells having respective band gaps for receiving the respective bands, such as blue, green, and red color optical bands that are focused onto the respective solar cells that are all protected by the solar shield. The transmitted light that includes harmful radiation passes through and out of the glass substrate. The waveguide serial solar concentrator can be an integrated device using the supportive glass substrate.

Referring to all of the figures, the solar concentrator can be used to convert light from any light source provided that the light spectrum falls within the energy band gaps of the solar cells for conversion of light energy into generated electrical energy. The HOE separator, HOE concentrator, and HOE reflector preferably include respective chirp Bragg gratings, such as chirp Bragg grating CBG of Hoe Separator $\theta_R$ shown in Fig 1, that are designed for reducing aberrations of the separated bands, concentrator bands, and reflected bands. The aberration generation has optical wave dispersion and wavelength shifts. Those skilled in the art can design matching HOE separators, HOE concentrators, and HOE reflectors using chirp Bragg gratings for reducing aberrations of the separator bands, concentration bands, and the reflected bands.

The principle of operation and applicability of the HOE solar concentrator lies in the recording geometry and processing, which will extend the limited bandwidth of HOEs in comparison to the baseline solar spectrum and quantum efficiency of the solar cells. In general, volume HOEs, while angle and wavelength selective, have limited bandwidths. Because of this selectivity, the recording and reconstruction or readout geometries and wavelengths are different. The HOE separator is a collector system that diffracts the useful portion of a multispectral radiation without dispersion and aberration and couples the separated bands into a spacer or waveguide that propagates the separated bands to a point of concentration, away from the incidence direction, to protect the photovoltaic active cells from natural or man-made space radiation environments.

The angle and wavelength selectivity of volumetric HOEs provide an opportunity to design an HOE that spectrally and spatially separates an incident multispectral beam into component spectra bands. The HOE separator can be specifically designed to respond only to incident beams from a specific direction. Non-uniform spatial frequencies are inscribed within the volume of the separator hologram, which responds only to beams incident from the directions for which the spatial frequencies were created. All other beams pass through the HOE separator. The HOE separator diffracts the incident beam in accordance to the Bragg condition $\sin \mu \theta_i + \sin \theta_c = \lambda_c/\Lambda$, where $\theta_i$ is the angle into which the incident beam is diffracted, $\lambda_c$ is the beam incident wavelength, and $\Lambda$ is the spatial period inscribed in the volume of the HOE separator so as to respond to the incident beam from a desired incident direction. The diffracted separator beam is coupled into the waveguide at angle $\theta_i$ and is propagated to a distal point of concentration.

To cover a wide range of incidence angles, that is a field of view, several HOE separators can be multiplexed in the same volume of the hologram or laminated together, with each multiplexed or laminated HOE separator responding only to a specific beam direction, for example, incident beams $\theta_B$, $\theta_O$, and $\theta_R$. For the solar HOE, advantage is had by designing a multiplexed HOE and PV combination that covers a wide range of incident angles from $\theta_B$, to $\theta_O$, to $\theta_R$ of radiation from the sun. This eliminates the need for additional tracking devices to track the sun. Using explicit angular analysis, the recording angles are adjusted, such that, a range of received beams of the same or different wavelengths from various incidence angles are brought to a defined focus, which can be coupled into a waveguide. This focal location can be either a spot or a line image.

The solar concentrator can have a wide field of view $\phi$ for passive sun tracking without any additional tracking device. The $\theta_B$ HOE separator only responds to beams from the $\theta_B$ direction, diffracted to the common focus. Similarly, the $\theta_O$ HOE separator is for normal incidence beam direction $\theta_O$. The $\theta_R$ HOE separator is for beams incident for $\theta_R$ directions. The three multiplexed HOEs may have a total film thickness of approximately 45 μm with the sun being tracked within the field of view $\phi$.

The capabilities of the band selection holographic optics for generating solar power enable holographic energy conversion of solar power for suitable use in spacecraft missions, as well as alternative energy production both for terrestrial and space power applications. The use of broadband solar HOEs in conjunction with a thin waveguide can efficiently generate solar power. The solar concentrator can be shielded or protected from natural or man-made space environments. The HOE solar concentrator provides an effective approach to protect photovoltaic active components from natural or man-made space environmental radiation threats without moving parts for sun tracking. The solar concentrator can be made cost effectively without polishing. The holographic recording materials are inexpensive, and the cost of fabricating the solar HOE concentrator can be inexpensive.

The HOE solar concentrator uses non-mechanical components and can be a robust hybrid device with no moving part while rejecting harmful natural or man-made radiation to provide band selected high-efficiency power conversion and generation. For spacecraft power generation, the device can be made lightweight and be thin film with about 15 μm in thickness for concentrating aberration compensated bands in holographic optical element volumes that splits the incident solar radiation into component wavelength bands for corresponding PV power conversion. The transmitted light prevents undesirable radiation from exposing the PV cells. The concentrator can provide greater power conversion efficiency at reduced weight and stowed volume, matching selected band spectrum to PV cell band gaps for improved solar cell conversion efficiency.

The band selection holographic optical solar concentrator can comprise thin waveguides sandwiched between large bandwidth concentrating and reflecting holographic optical elements that are band selection HOEs. The HOE concentrator preferably compensates for aberration and dispersion introduced by the HOE separator. The reflecting HOE redirects diffracted selected concentration bands into the waveguide for remote communication of the concentrated bands. The use of internal reflection and the use of selected solar wavelength bands from the HOE concentrator, with diffraction at an angle greater than the critical angle of the waveguide, enable the concentrated bands to propagate in and through the waveguide, away from the incidence direction and to the band selection HOE reflector, which then directly injects the selected solar radiation bands into the PV cells of appropriate band gap energies.

The solar concentrator has desirable properties that include high diffraction efficiency, high signal-to-noise-ratio, high angular and spectral filtering selectivity, concentrated optical power, lightweight, thin planar shape, flat optics without required polishing, low cost, wavelength-multiplexing capability, insensitivity to misalignment, and simplicity of fabrication. The HOEs have unique properties that can be exploited to separate the solar spectra received from a wide range of incidence angles, into optical bands, which are brought to a common or serial focus and away from the direction of solar light incidence. The wavelength multiplexing advantage can be realized by multiple HOEs multiplexed in the same holographic volume with each HOE separator responding to a specific incidence angular direction. Thus, the multiplexed multiple HOE separator has advantages of collecting solar radiation from a wide range of incidence angles and provides for passive sun tracking, without any moving parts, without additional tracking devices, and without damage to the PV cells. The lightweight and flexibility of the solar concentrator is uniquely suitable for use in a variety of solar array shapes, sizes, and designs, including multiple junction thin film solar cells. The HOE can be fabricated in any of the commercially available high-efficiency photosensitive holographic recording materials.

The solar concentrator reduces system costs to mostly the costs of the photovoltaic cells, which are the most expensive part of the solar array. The solar concentrator can be mass-produced. Large format holographic optical elements with high optical quality and diffraction efficiency can be mastered and mass-produced. These can be cut to sizes for lamination along the lengths of the solar arrays. Because of the holographic principle, a large number of HOEs can be multiplexed in the same volume of a thin HOE to meet the requirements for low specific weight and volume of spacecraft. The solar concentrator can be a universal energy conversion device that is amenable to many configurations, shapes, sizes, and designs of solar arrays, and can be integrated with existing multijunction or thin film solar array systems. The solar concentrator can be used to convert power from any light source as a generalized light concentrator. The holographic solar concentrator has applications in a wide variety of fields. Those skilled in the art can make enhancements, improvements, and modifications to the invention, and these enhancements, improvements, and modifications may nonetheless fall within the spirit and scope of the following claims.

What is claimed is:

1. A light concentrator for generating power based on received light, the concentrator comprising:
   a substrate;
   a photovoltaic (PV) cell integrally disposed on the substrate;
   a shield disposed on at least one surface of the PV cell, wherein the shield is disposed on a surface of the PV cell facing the received light, and is configured to block the received light from directly irradiating the PV cell;
   a holographic diffraction grating-based separator integrally disposed on the substrate and configured to receive the light and to separate a first portion of the received light into separated optical bands and to transmit a second portion of the received light;
   a multiple holographic diffraction grating-based concentrator integrally disposed on the substrate and configured to receive the separated optical bands from the separator and to concentrate the separated optical bands into concentrated bands and to transmit the second portion of the received light; and
   a multiple holographic diffraction grating-based reflector integrally disposed on the substrate and configured to receive the separated optical bands from the concentrator and to reflect the concentrated bands as reflected bands to the PV cell and to transmit the second portion of the received light,
   wherein the PV cell is configured to receive the reflected bands from the reflector and to generate the power based on the reflected bands, the PV cell comprising a multiple junction PV cell having multiple junctions configured to receive the reflected bands, and
   wherein the substrate is transparent such that the second portion of the received light passes through the substrate as transmitted light, and
   wherein the PV cell is disposed within a first plane and the reflector is disposed within a second plane parallel to the first plane, the first plane being nearer to a source of the light than is the second plane.

2. The light concentrator of claim 1, further comprising a separator spacer integrally disposed on the substrate between the separator and the concentrator.

3. The light concentrator of claim 1, wherein the separator comprises a plurality of holographic diffraction grating-based separators, each of the holographic diffraction grating-based separators being configured to receive the light at respective different angles of incidence of the light.

4. The light concentrator of claim 1, further comprising a concentrator spacer integrally disposed on the substrate between the concentrator and the reflector.

5. The light concentrator of claim 1, further comprising a waveguide configured to guide the concentrated bands to the reflector.

6. The light concentrator of claim 5, wherein the reflector and the PV cell are laterally displaced from the concentrator, and the waveguide is configured to conduct the concentrated bands from the concentrator to the reflector.

7. The light concentrator of claim 1, wherein the concentrator is configured to concentrate a predetermined number of optical wavelength bands and wherein the reflector is configured to reflect the predetermined number of optical wavelength bands.

8. The light concentrator of claim 7, wherein the PV cell includes a number of multiple junctions equal to the predetermined number of optical wavelength bands.

9. The light concentrator of claim 1, wherein the PV cell comprises a stacked PV cell having the multiple junctions.

10. The light concentrator of claim 1, wherein the PV cell comprises a series of PV cells having respective junctions of the multiple junctions.

11. The light concentrator of claim 1, wherein each of the separator, the concentrator, and the reflector comprises a Bragg grating.

12. The light concentrator of claim 11, wherein the Bragg gratings reduce aberrations of the separated optical bands, the concentrated bands, and the reflected bands for improved conversion efficiency of the light into the power.

13. The light concentrator of claim 1, wherein each of the separator, the concentrator, and the reflector comprises a chirp Bragg grating.

14. The light concentrator of claim 1, wherein the shield is disposed over all but one surface of the PV cell, the one surface being positioned to receive the reflected bands.

15. The light concentrator of claim 1, wherein the light concentrator is a solar concentrator, the power is solar power, the PV cell is a PV solar cell, and the light is sunlight.

* * * * *